Oct. 9, 1973 R. G. HAYS 3,764,410
METHOD OF MAKING ULTRA-FINE GEOMETRY PLANAR SEMICONDUCTOR DEVICES
Filed March 13, 1972 2 Sheets-Sheet 2
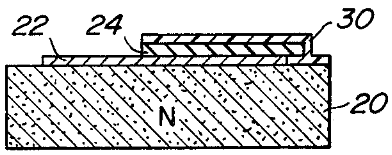
FIG. 9
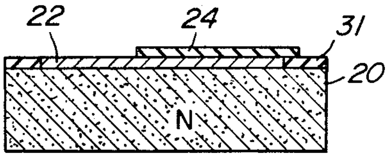
FIG. 10
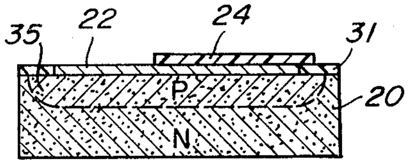
FIG. 11
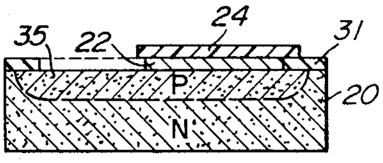
FIG. 12
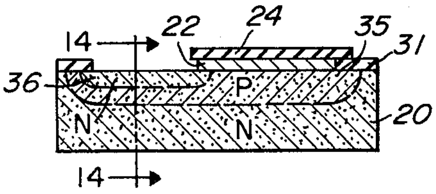
FIG. 13
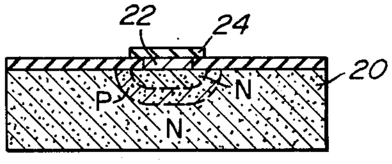
FIG. 14
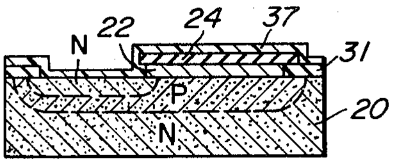
FIG. 15
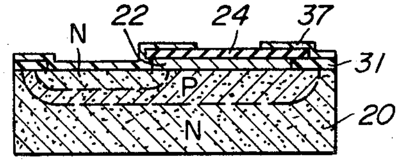
FIG. 16
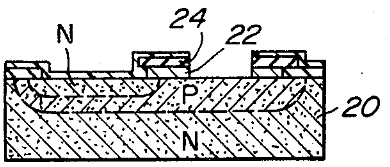
FIG. 17
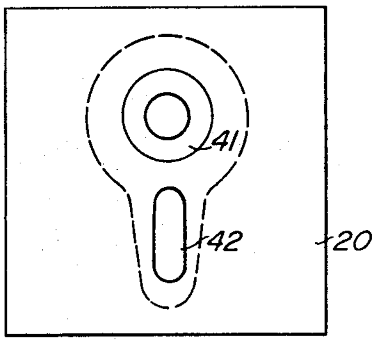
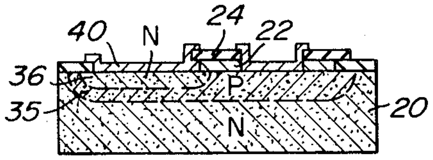
FIG. 18
FIG. 19

United States Patent Office 3,764,410

Patented Oct. 9, 1973

3,764,410

METHOD OF MAKING ULTRA-FINE GEOMETRY PLANAR SEMICONDUCTOR DEVICES

Robert G. Hays, Scottsdale, Ariz., assignor to Motorola, Inc., Franklin Park, Ill.

Filed Mar. 13, 1972, Ser. No. 234,200
Int. Cl. H01l 7/34
U.S. Cl. 148—187 10 Claims

ABSTRACT OF THE DISCLOSURE

A method of making ultra-fine geometry planar-type semiconductor devices on a semiconductor substrate of one conductivity type through using ultra-fine shaped areas of dopant material to provide semiconductor regions of an opposite conductivity type and then using access windows formed by removing the dopant material to provide another semiconductor region of the one conductivity type. The dopant material can be either of P-type or N-type conductivity and is formed into an ultra-fine geometry through using silicon oxide as a mask in a double etching step.

BACKGROUND OF THE INVENTION

This invention relates to small geometry semiconductor devices and more particularly to an improved method of making such devices having planar construction.

Semiconductor devices intended for high frequency application, such as in the microwave frequency regions, require fine geometry junction barriers, smaller than the minimum size geometry previously possible and/or practical to form. Prior art techniques utilized multiple access windows in oxide layers which required more tolerance in alignment than was available in the semiconductor regions. This manufacturing limitation of the prior art is overcome by the present invention through obviating the necessity to align windows in the oxide layers. A planar semiconductor structure of extremely fine geometry is constructed through the use of a single window in the oxide layer and a dopant material which has been selectively etched.

Another limitation in manufacturing fine geometry semiconductor devices having a planar-type configuration relates to the minimum size of ohmic contacts that can be successfully made to active regions of a transistor having emitter-base and collector-base junctions. In particular, the planar semiconductor device increases the difficulty through its presentation of these two junctions on the same surface of a semiconductor substrate. In the present invention, dopant material is utilized to provide a semiconductor region in a substrate and, by its subsequent removal, to define an access window through which another semiconductor region is formed within the first region, and the window is ultimately used to form a contact with the second (smaller) semiconductor region.

SUMMARY OF THE INVENTION

It is therefore an object of the present invention to provide a planar-type semiconductor device utilizing a finely etched dopant material to provide a semiconductor regions of a selected conductivity type and to provide an extremely small access window in a protective oxide layer through the subsequent removal of the dopant material.

It is another object of the invention to provide an improved method of selectively etching a dopant layer on a semiconductor substrate whereby areas of dopant material smaller than normally obtainable by standard etching processes are provided.

A method for making ultra-fine geometry planar-type semiconductor devices by providing a substrate body of semiconductor material of one conductivity type on which to form a layer of dopant active material of an opposite conductivity type, forming a layer of silicon oxide on said dopant layer, selectively etching portions of said silicon oxide to expose portions of said dopant layer, selectively etching exposed portions of said dopant layer and etching portions of said dopant layer from beneath unetched portions of said silicon oxide thereby obtaining remaining portions of said dopant layer smaller than the unetched portions of said silicon oxide, removing the silicon oxide and forming another layer of silicon oxide on said substarate, diffusing first semiconductor regions into said substrate from the remaining portion of said dopant layer, removing a portion of said dopant layer to define an access window in said silicon oxide, and diffusing second semiconductor regions of said one conductivity type into said substrate and into said first semiconductor regions through said window to form a transistor device of ultra-fine geometry.

These and other aspects of the invention will become apparent to those skilled in the art as the invention is described in connection with the accompanying drawings.

BRIEF DESCRIPTION OF THE DRAWINGS

Referring to the drawings, wherein like characters indicate like parts throughout the figures, FIGS. 1–19 are cross-sectional views and top plans illustrating the various steps of a preferred method for making ultra-fine geometry semiconductor devices.

DESCRIPTION OF THE PREFERRED EMBODIMENT

Figure 1:
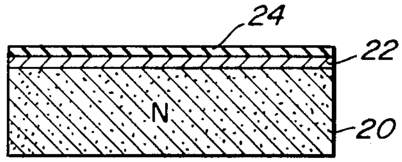

Referring specifically to FIG. 1, a substrate 20 is illustrated which is composed of semiconductor material of a selected conductivity type, such as N-type silicon. It should be noted that P-type semiconductor material could be used, or a chosen conductivity type semiconductor material could be provided as an initial layer on a neutral conductivity substrate to obtain the equivalent of the substrate 20, but N-type conductivity material will be utilized in this embodiment for illustrative purposes. A layer 22 of material containing dopant of the opposite conductivity type (in this embodiment P-type) is then provided on the substrate 20. A protective insulating layer 24, of silicon oxide (as in this embodiment) or any other suitable dielectric or passivator, is superimposed over the layer 22. The dopant layer 22 is an impurity donating glass containing significant donor or acceptor impurities with which to dope given areas of the substrate 20 in order to render the doped layers conductive by means of a predominance of electrons or holes, respectively. Because of selective etching techniques utilized in the present method, which will be explained in detail presently, the dopant layer 22 must be a material which can be removed by an etchant that will not remove the insulating layer 24 and which will not be removed by an etchant that will remove the insulating layer 24. In the present embodiment the dopant layer 22 is formed of aluminum oxide ($Al_2O_3$). The etchant for the insulating layer 24 is a weak or buffered solution of one of the hydrofluoric acids, such as Hf, and the etchant for the dopant layer 22 is hot phosphoric acid ($H_3PO_4$).

Figure 2:
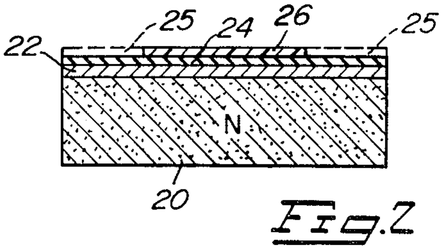
Figure 4:
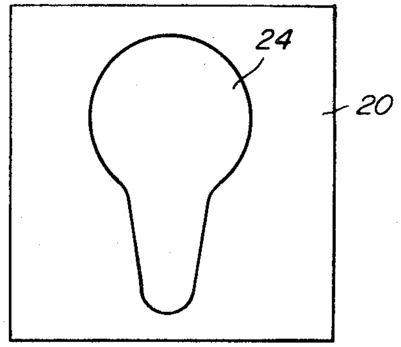

It is desired now to form an ultra-fine geometry semiconductor device, such as an N-P-N transistor of planar-type configuration, having deposited areas measuring approximately 1 micron or less across a surface dimension thereof. Standard etching processes yield deposited areas defined in the order of 2.5 microns (surface dimension) so that these processes are very limited in use for producing high frequency semiconductor devices. The present method was developed to produce ultra-fine geometry semiconductor devices with relative ease, accuracy and reliability. In accordance with the present method, FIG. 2 illustrates a photosensitive photoresist masking layer 26 formed in overlying relationship on the silicon oxide layer 24. The photoresist mask 26, which has positive photosensitive characteristics so as to become insoluble when exposed, is photodeveloped in a desired pattern (see FIG. 4) and then removed in the area 25 to expose surface portions of the silicon oxide layer 24.

Figure 3:
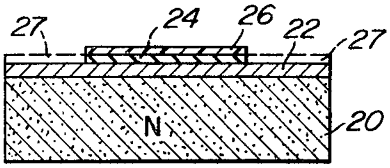
Figure 5:
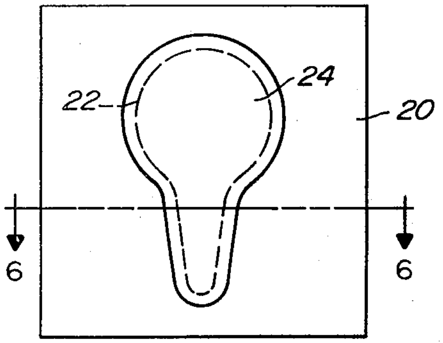
Figure 6:
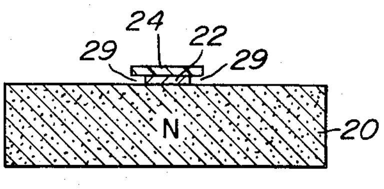

The exposed portions of the silicon oxide layer 24 are subjected to a suitable etchant, such as a weak solution of a hydrofluoric acid which is selected to etch the layer 24 and not etch the layer 22, so as to remove area 27 as indicated by the dash lines in FIG. 3. The photoresist mask 26 is of no further use and may be removed at this point of the process. The dopant layer 22 is subjected to an etchant which is active to remove exposed portions of the layer 22 but not remove the silicon oxide layer 24 of the substrate 20 (as previously described). Hot phosphoric acid ($H_3PO_4$) dissolves the aluminum oxide dopant layer 22 at a known rate so that the exposed portions of the layer 22 are removed in a pattern determined by the remaining insulating layer 24 and the layer 22 is removed from beneath the layer 24, indicated by the undercut areas 29 in FIG. 6, to a depth dependent upon the length of time the etching step is continued. Referring to the view in top plan of FIG. 5, the narrow portions of the pattern, produced by standard photoresist pattern techniques, have a surface dimension (across the narrow finger of the pattern) of approximately 2.5 microns, in this embodiment. After undercutting, the layer 22 has a width (across the narrow finger of the pattern) of approximately 1 micron or less. Thus, it can be seen, that through proper timing and the use of the selective etching technique, significantly finer geometric patterns can be produced.

Figure 7:
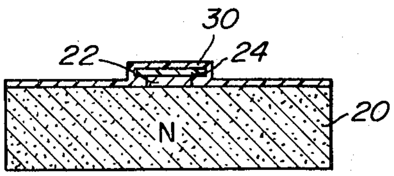
Figure 8:
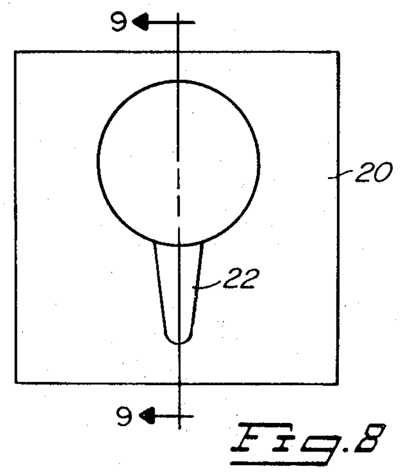

Referring to the cross-sectional view in FIG. 7 and the top plan in FIG. 8, the exposed surfaces of the substrate 20, the aluminum oxide layer 22 and the silicon oxide layer 24 are covered with a layer 30 of photoresist materials, which may be the same photoresist material previously described. The layer 30 is removed from all portions of the device except the top and edges of the relatively large circular portion of the pattern. With the finger of the portion exposed, the device is subjected to a buffered solution of hydrofluoric acid to remove the overlying portion of layer 24 and expose the finger-shaped fine geometry portion of layer 22, as illustrated in top plan in FIG. 8 and the cross-sectional view of FIG. 9.

The remaining portion of the photoresist layer 30 may now be removed and the exposed surface portions of the substrate 20, which surround the aluminum oxide layer 22, are then covered with a newly grown layer 31 of insulating material, such as silicon oxide. It is necessary to grow the new layer of silicon oxide by steam oxidation techniques so as not to form the silicon oxide on the aluminum oxide. In the present embodiment, the thicknesses of the layers of silicon and aluminum oxide are on the order of 1000 to 3000 angstroms, but those skilled in the art may vary the thicknesses to suit desired functions of the device.

The device is subjected to a diffusion step, wherein the structure of FIG. 10 is placed in a furnace and treated within a selected controlled temperature range and reducing ambient conditions (for example a pure hydrogen atmosphere), to cause the desired diffusion of P-type impurities from the remaining portions of layer 22 into the silicon substrate 20. A resulting P-type semiconductor region 35 (outlined in dotted lines in FIG. 11) is formed beneath the aluminum oxide layer 22 and the depth of penetration into the substrate 20 is controlled by the time of exposure, level of exposure temperature, and control of ambient conditions.

The device is now treated with hot phosphoric acid to remove the exposed fine geometry portion of the aluminum oxide layer 22 and form an access window (see FIG. 12) having a width of approximately 1 micron or less, (the dimensions of the window being equal to the dimensions of the finger of aluminum oxide layer 22) and extending the length of the finger of the pattern. It shoud be noted that a portion of the aluminum oxide layer 22 (within the relatively large circular portion of the pattern) will remain beneath the silicon oxide layer 24. Because of the novel method utilized to construct the device, the elongated 1 micron wide window is centered over the P-type semiconductor region 35 and exposes a portion of the upper surface thereof for the subsequent operation. This self-alignment produced by the prescribed selective etching technique allows the use of much finer geometric patterns with an increased reliability.

Utilizing the above-described access window, an N-type semiconductor region 36 is formed approximately centrally within the P-type region 35. The N-type region formation is readily accomplished by a step of exposing the substrate embodiment of FIG. 12 to a suitable carrier gas stream such as hydrogen containing N-type dopant impurities. Again the depth of penetration of the N-type region 36 is solely determined by the time of exposure, level of exposure temperature, and control of ambient conditions. The substrate 20, P-type conduction region 35 and N-type conduction region 36 are the collector, base and emitter, respectively, of an N-P-N transistor. As previously mentioned the materials and dopants may be altered to form a P-N-P type transistor if desired.

Because of the extremely small area of the N-type region or emitter 36 of the transistor, it would be extremely difficult to provide contacts thereto in the usual manner. However, contacts to the emitter region 36 and the base region 35 can be formed relatively easily through use of the structure illustrated in FIGS. 13 and 14 and the following technique.

The exposed surfaces of the substrate 20, layer 22, layer 24 and layer 31 are covered with a layer 37 of photoresist material, such as that previously described. The photoresist layer 37 is exposed and treated to provide an access opening, as illustrated in FIG. 16, approximately centrally located over the large circular portion of the base region 35. This opening is then treated with a dilute or buffered solution of hydrofluoric acid to remove the portion of silicon oxide layer 24 underlying the opening in the photoresist layer 37. After treatment with the weak solution of hydrofluoric acid, hot phosphoric acid is utilized to remove the portion of the aluminum oxide layer 22 exposed by the opening described. Thus, a generally circular (or other desired geometric configuration) access window is formed, through the silicon oxide layer and aluminum oxide layer, to expose a generally central portion of the relatively large round portion of base 36, as illustrated in FIG. 17. The upper surface of the structure is then metalized to form a layer 40 of contact metal in engagement with the substrate 20 through the elongated access window overlying the emitter region 36 and through the circular access window overlying the large circular portion of the base region 35. Excess portions of the contact metal layer 40 are removed to provide a circular base contact 41 and an elongated emitter contact 42, as illustrated in top plan in FIG. 19. It is of course understood by those skilled in the art that a plurality of the above-described transistors can be formed simultaneously on a single chip of substrate material if desired.

While I have shown and described a specific embodiment of this invention, further modifications and improvements will appear to those skilled in the art. I desire it to be understood, therefore, that this invention is not limited to the particular form shown and I intend in the appended claims to cover all modifications which do not depart from the spirit and scope of this invention.

I claim:

1. A method of making ultra-fine geometry planar-type semiconductor devices comprising the steps of:

(a) providing a semiconductor substrate having a first type of conductivity;

(b) forming a layer of dopant material on said substrate, said dopant material being etchable at a known rate with a first etchant and not etchable with a second etchant;

(c) forming a first layer of insulating material on said layer of dopant material, said insulating material being etchable with said second etchant and not etchable with said first etchant;

(d) selectively etching portions of said first insulating layer with said second etchant to expose portions of said dopant layer and to mask remaining portions thereof;

(e) selectively etching exposed portions of said dopant layer and selected portions of said masked remaining portions with said first etchant to provide said dopant layer with a desired configuration including a fine geometry portion;

(f) selectively etching a portion of said first insulating layer from said dopant layer with said second etchant to expose the fine geometry portion of said dopant layer;

(g) forming a second layer of insulating material on said substrate surrounding said dopant layer and in masking relationship to the edges of said dopant layer;

(h) diffusing a first region of a second type of conductivity into said substrate from said dopant layer;

(i) forming a fine geometry window by removing at least a portion of the exposed fine geometry portion of said dopant layer with said first etchant to expose a generally central portion of said first region of said substrate; and (j) diffusing through said window a second region of the first type of conductivity into said substrate within said first region.

2. A method as set forth in claim 1 having in addition the steps of, subsequent to diffusing the second region, selectivity etching a second window through said first insulating layer and said dopant layer to expose said substrate within said first region and metalizing said substrate through said fine geometry window and said second window to form contacts with said second and said first regions, respectively.

3. A method as set forth in claim 1 wherein the dopant material is aluminum oxide.

4. A method as set forth in claim 3 wherein the first etchant is hot phosphoric acid.

5. A method as set forth in claim 4 wherein the insulating material is silicon oxide.

6. A method as set forth in claim 5 wherein the second etchant is a buffered solution of hydrofluoric acid.

7. A method as set forth in claim 1 wherein the selective etching of said dopant layer continues until the fine geometry portion thereof has a surface dimension of less than one micron.

8. A method as set forth in claim 1 wherein the second layer of insulating material is formed by steam oxidation techniques.

9. A method as set forth in claim 1 wherein the diffusing of the first region is performed within a controlled temperature and reducing ambient conditions to control the depth of penetration.

10. A method as set forth in claim 9 wherein the reducing ambient conditions include a substantially pure hydrogen atmosphere.

References Cited

UNITED STATES PATENTS

| | | | |
|---|---|---|---|
| 3,681,155 | 8/1972 | Elgan et al. | 148—188 |
| 3,514,348 | 5/1970 | Ku | 148—188 |
| 3,482,150 | 12/1969 | Wolfrum et al. | 317—235 WW X |
| 3,388,000 | 6/1968 | Waters et al. | 117—212 |
| 3,479,237 | 11/1969 | Bergh et al. | 148—187 X |
| 3,698,071 | 10/1972 | Hall | 148—186 X |

GEORGE T. OZAKI, Primary Examiner

U.S. Cl. X.R.

148—33.3, 187, 188; 317—235 R